United States Patent
Kikuchi et al.

(10) Patent No.: US 7,114,110 B2
(45) Date of Patent: Sep. 26, 2006

(54) SEMICONDUCTOR DEVICE, AND THE METHOD OF TESTING OR MAKING OF THE SEMICONDUCTOR DEVICE

(75) Inventors: Shuji Kikuchi, Yokohama (JP); Tadanobu Toba, Yokohama (JP); Katsunori Hirano, Yokohama (JP); Yuji Sonoda, Hiratsuka (JP); Takeshi Wada, Akishima (JP)

(73) Assignee: Renesas Technology Corp., Tokyo (JP)

( * ) Notice: Subject to any disclaimer, the term of this patent is extended or adjusted under 35 U.S.C. 154(b) by 349 days.

(21) Appl. No.: 10/413,135

(22) Filed: Apr. 15, 2003

(65) Prior Publication Data

US 2003/0210069 A1 Nov. 13, 2003

(30) Foreign Application Priority Data

Apr. 15, 2002 (JP) .............................. 2002-111735

(51) Int. Cl.
*G01R 31/28* (2006.01)
*G06F 11/00* (2006.01)

(52) U.S. Cl. ...................... 714/736; 714/739; 324/765
(58) Field of Classification Search ...................... None
See application file for complete search history.

(56) References Cited

U.S. PATENT DOCUMENTS 6,034,905 A * 3/2000 Suzuki et al. ............... 365/201
6,097,206 A * 8/2000 Takano ........................ 324/765
6,801,050 B1 * 10/2004 Takechi et al. .............. 324/765

FOREIGN PATENT DOCUMENTS

| JP | 08-107185 | 4/1998 |
|----|-----------|--------|
| JP | 10-090362 | 4/1998 |
| JP | 2000-090693 | 3/2000 |
| JP | 2000-97998 | 4/2000 |
| JP | 2001-285616 | 9/2001 |

OTHER PUBLICATIONS

H. Koike et al., "A Bist Scheme Using Microprogram ROM for Large Capacity Memories", International Test Conference Paper 36.1, pp. 815-822, 1990.
B. Cockbur, et al., "Synthesized Transparent BIST for Detecting Scrambled Pattern-Sensitive Faults in RAMs", International Test Conference, Paper 2.2, pp. 23-32, 1995.
Ternullo, Jr., et al., "Deterministic Self-Test of a High-speed Embedded Memory and Logic Processor Subsystem", International Test Conference, Paper 2.3, pp. 33-44, 1995.

* cited by examiner

*Primary Examiner*—Christine T. Tu
(74) *Attorney, Agent, or Firm*—Antonelli, Terry, Stout and Kraus, LLP.

(57) ABSTRACT

A signature circuit, i.e., a random-number generating circuit, is provided in a memory test apparatus. Also, a signature circuit is provided in each of devices-under-test. This configuration allows the large number of semiconductor integrated-circuit devices to be tested at one time with a high efficiency. This condition realizes a tremendous reduction in the test cost.

5 Claims, 11 Drawing Sheets

| COMMANDS | DATA PINS | DUT i/o | INSIDE OF DUT |
|---|---|---|---|
| MODE1 ↓ Write ↓ NOP ↓ NOP ↓ Read ↓ · · · · · · MODE2 | WDTa ↓ WDTb ↓ Hi-z ↓ Hi-z ↓ Hi-z ↓ Hi-z · · · sigDT1 · · sigDT8 | i i - - - - o o | RDTa→siga ↓ RDTb→sigb · · · |

| COMMANDS | TEST MODE1 | Write | Nop | Nop | Nop | Nop | Read | | | | | |
|---|---|---|---|---|---|---|---|---|---|---|---|---|
| EXPECTATION VALUES | | | x00 | x88 | x04 | xCA | | | | | | |
| TESTER SIGNATURE CIRCUIT | | | xFF | x7F | xB7 | xDF | xA5 | | | | | |
| DUT1 INTERNAL-CIRCUIT OUTPUT | | | | | | | | x00 | x88 | x04 | xCA | |
| DUT1 SIGNATURE CIRCUIT | | | | | | | | xFF | x7F | xB7 | xDF | xA5 |
| DUT2 INTERNAL-CIRCUIT OUTPUT | | | | | | | | x00 | x88 | x14 (C1) | xCA | |
| DUT2 SIGNATURE CIRCUIT | | | | | | | | xFF | x7F | xB7 | xCF | x2D |

| COMMANDS | DATA PINS | DUT i/o |
|---|---|---|
| Write ↓ | | |
| NOP ↓ | WDTa ↓ | i |
| NOP ↓ | WDTb ↓ | i |
| Read | Hi-z ↓ | - |
| · | | |
| · | Hi-z ↓ | - |
| · | RDTa ↓ | o |
| · | RDTb | o |
| · | · | |
| | · | |

SEMICONDUCTOR DEVICE, AND THE METHOD OF TESTING OR MAKING OF THE SEMICONDUCTOR DEVICE

BACKGROUND OF THE INVENTION

1. Field of the Invention

The present invention relates to a semiconductor testing apparatus, a semiconductor integrated-circuit device, and semiconductor integrated-circuit device testing method and fabricating method. More particularly, it relates to a technology that is effective when applied to the implementation of a high efficiency in the memory test for a synchronous DRAM or the like.

2. Description of the Related Art

In general, in a semiconductor integrated-circuit device, various types of tests are carried out before the shipment thereof or the like. One example is a function test for confirming whether or not the semiconductor memory operates exactly in accordance with a predetermined function as was expected. These tests make a selection between a good die and a defective one.

Figure 13:
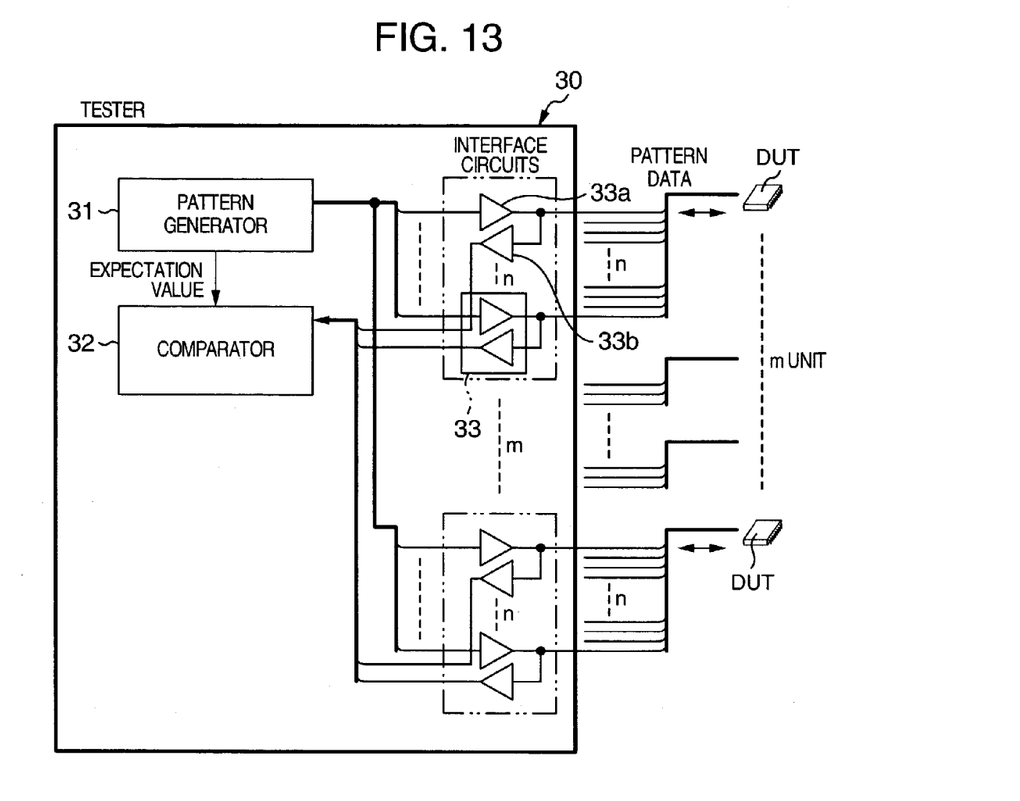
FIG. 13 is the block diagram of the tester that the present inventor has devised and examined.

FIG. 13 is a configuration diagram of a tester 30 that the present inventor has devised and examined. The tester 30 tests the semiconductor integrated-circuit device, e.g. the synchronous DRAM.

The tester 30 includes a pattern generator 31, a comparator 32, interface circuits 33, and the like. The pattern generator 31 generates an application pattern to be applied to input pins of the semiconductor memory, i.e., device-under-test and an expectation pattern expected of output pins thereof, respectively.

The comparator 32 makes a comparison between a response pattern from the semiconductor memory and the expectation pattern thereof, thereby judging whether the semiconductor memory is passing or defective. The interface circuits 33 are interfaces located between the tester 30 and the semiconductor integrated-circuit device.

The tester 30 includes n units of the interface circuits 33. Each interface circuit 33 includes drivers 33a and comparators 33b, which are connected to the pins of the semiconductor integrated-circuit device.

If the tester 30 has the interface circuits that are equivalent to, e.g., 128 pins in number (i.e., 128 units), in the case of a semiconductor integrated-circuit device having 32 pins, it turns out that 4 units of the semiconductor integrated-circuit devices at the maximum are connected to the tester and are tested simultaneously.

The drivers 33a are connected to the input pins of the semiconductor integrated-circuit device, respectively. The application pattern is applied to the input pins of the semiconductor integrated-circuit device via these drivers 33a. The comparators 33b, based on voltage-level judgements, convert the output response, which is outputted from the semiconductor integrated-circuit device, into logical values (: H/L), then outputting the logical values to the comparator 32.

Figure 14:
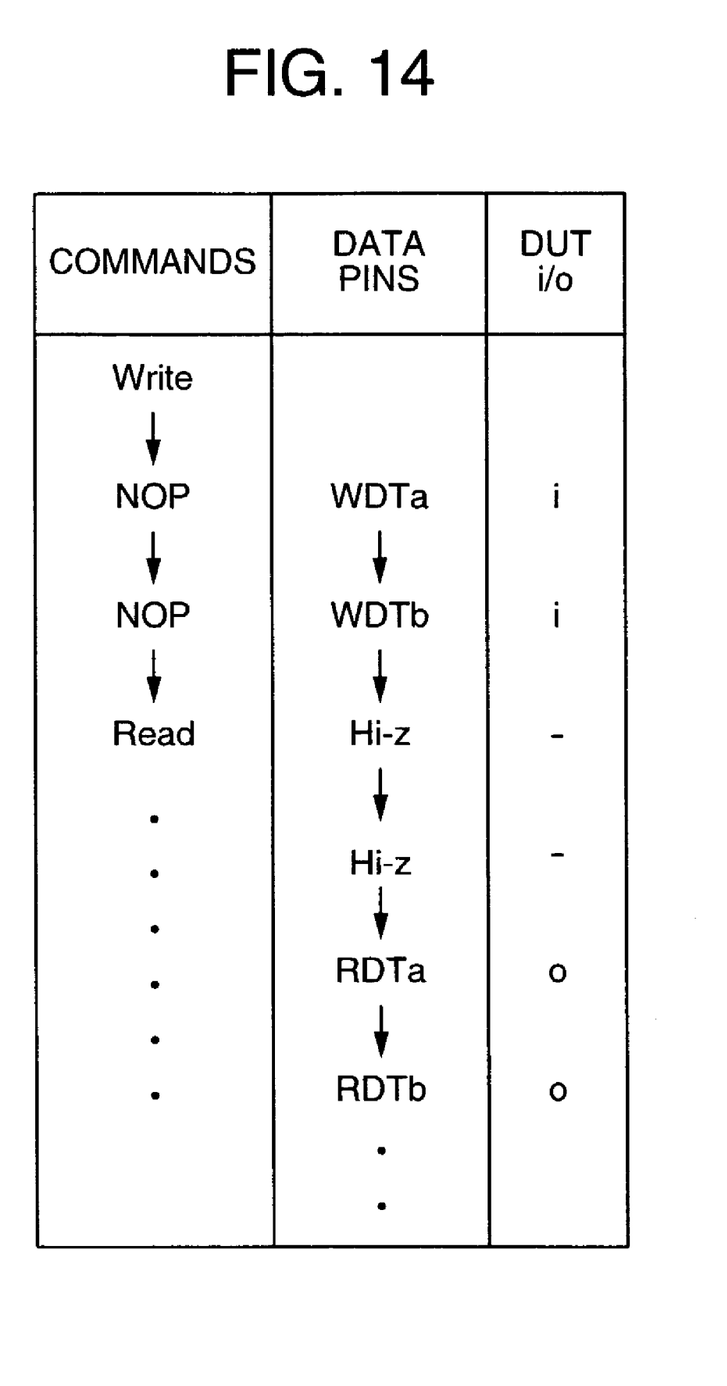
FIG. 14 is the configuration diagram for illustrating the example of the test pattern used in the tester in FIG. 13.
Figure 15:
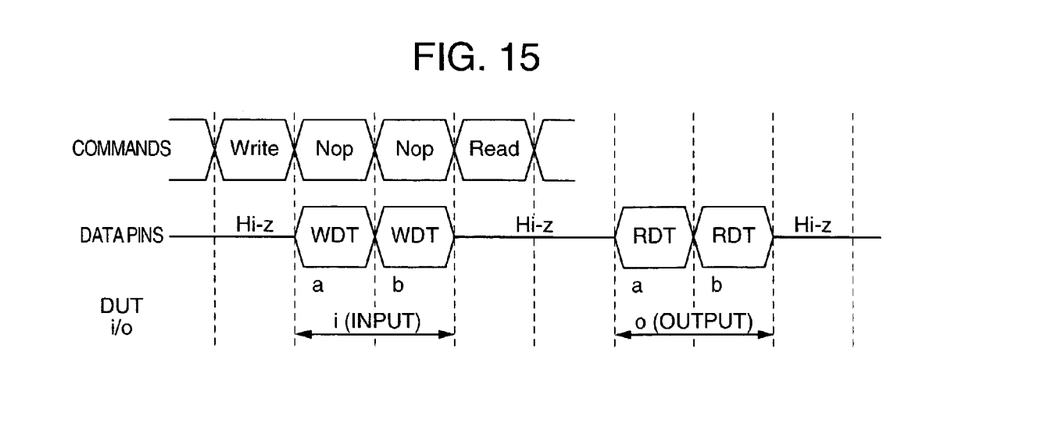
FIG. 15 is the operation timing chart based on the test pattern in FIG. 13.

Also, FIG. 14 is a configuration diagram for illustrating an example of the test pattern used in the tester 30, and FIG. 15 is an operation timing chart therefor.

FIG. 14 illustrates, from the left to the right, the following information, respectively: Commands outputted from the tester 30 to the semiconductor integrated-circuit device, i.e., the device-under-test, signal states in the data pins of the semiconductor integrated-circuit device, states of the signals inputted/outputted into/from the semiconductor integrated-circuit device, and signal states inside the semiconductor integrated-circuit device.

FIG. 15 illustrates, from the above to the below, the following information, respectively: The commands outputted from the tester 30 to the semiconductor integrated-circuit device, the signal states in the data pins of the semiconductor integrated-circuit device, the signal states inside the semiconductor integrated-circuit device, and the states of the signals inputted/outputted into/from the semiconductor integrated-circuit device.

In this example, subsequently to a 'Write' command, 2 'Nop' commands and a 'Read' command are given one after another. At this time, the data pins provide write data at an input mode into the semiconductor integrated-circuit device. Otherwise, at the time of a read operation, the data pins receive read data that is returned thereto at an output mode from the semiconductor integrated-circuit device.

Also, some of the semiconductor integrated-circuit devices integrate therein a testing circuit for testing the logical gates from a small number of external terminals and with a high efficiency.

As a configuration of this testing circuit, there exists, e.g., the BIST (: Built In Self Test). The BIST integrates therein tester functions such as a test-pattern generating circuit, a test-output compressing circuit, and a test-result judging circuit. Namely, the BIST is a circuit that makes it possible to carry out the self test without using an external tester.

As the test-pattern generating circuit, an apparatus such as the LFSR (: Linear Feedback Shift Register) is employed which generates a random number. The test-pattern generating circuit has allowed the running of the pseudo random test and that of the all-number test for testing all the patterns.

Moreover, the test-output compressing circuit also employs the LFSR therein. The use of the LFSR allows the output-response pattern sequence to be compressed. Then, a comparison is made between a value that remains last and a correct expectation value, thereby carrying out the test.

Incidentally, as an example that has given a detailed explanation concerning this type of tester, there exists JP-A-2000-97998. This literature has disclosed a semiconductor testing apparatus that is capable of testing a semiconductor device such as the system LSI in a short time.

SUMMARY OF THE INVENTION

In the above-described test technology for testing the semiconductor integrated-circuit device, however, there exist the following problems:

Namely, at first, the data pins are of the bidirectional nature. Accordingly, if plural semiconductor integrated-circuit devices are simultaneously connected to one and the same tester pin, the response data, which are returned from the respective semiconductor integrated-circuit devices at the time of a read operation, turn out to compete and conflict with each other.

Consequently, the number of the tests for the semiconductor integrated-circuit devices is limited and determined by the number of the interface circuits provided in the tester. This situation results in a problem that the throughput in the tests for the semiconductor-integrated-circuit devices will be decreased.

Also, in the case of testing a large number of semiconductor integrated-circuit devices at one time, a large number of interface circuits become necessary in correspondence with the number of the pins of the semiconductor integrated-circuit devices. This situation results in a problem that the tester cost will be raised tremendously.

Furthermore, in the BIST, the test pattern used in the test is fixed. Accordingly, it is difficult to add a new test pattern or to change the already-existing test pattern after designing the device. This situation results in a problem that it is difficult to implement a flexibility in the test contents.

It is an object of the present invention to provide a semiconductor testing apparatus, a semiconductor integrated-circuit device, and semiconductor integrated-circuit device testing method and fabricating method, where it is possible to reduce the test cost exceedingly. This object is accomplished by testing a large number of devices under test at one time and with a high accuracy.

A semiconductor testing apparatus of the present invention includes a pattern generating circuit for generating a test waveform for testing a semiconductor integrated-circuit device, and generating pattern data including information on the test waveform, a judgement-data generating circuit for generating judgement reference data from the pattern data, and a comparing circuit for making a comparison between judgement response data and the judgement reference data, and judging whether or not the judgement response data and the judgement reference data match with each other, the judgement response data being outputted from the semiconductor integrated-circuit device, the judgement reference data being generated by the judgement-data generating circuit.

Also, the semiconductor integrated-circuit device of the present invention includes a test circuit for generating and outputting the judgement response data produced from response data during a test mode time-period, the response data being outputted from an internal circuit.

Moreover, a semiconductor integrated-circuit device testing method of the present invention includes the steps of connecting two or more semiconductor integrated-circuit devices to one interface circuit, inputting a test waveform into internal circuits of the two or more semiconductor integrated-circuit devices generating/holding judgement response data from respective response waveforms in the individual semiconductor integrated-circuit devices, the respective response waveforms being generated by the internal circuits, and making a comparison between the judgement response data and judgement reference data, the judgement response data being generated/held by the individual semiconductor integrated-circuit devices, the judgement reference data being set up in advance.

Also, a semiconductor integrated-circuit device testing method of the present invention includes the steps of connecting two or more semiconductor integrated-circuit devices to one interface circuit, inputting a test waveform into internal circuits of the two or more semiconductor integrated-circuit devices via the one interface circuit, generating/holding judgement response data produced from respective response waveforms in the individual semiconductor integrated-circuit devices, the respective response waveforms being generated by the internal circuits, and making a comparison between the judgement response data and judgement reference data, the judgement response data being generated/held by the individual semiconductor integrated-circuit devices, the judgement reference data produced from expectation data.

Furthermore, a semiconductor integrated-circuit device fabricating method of the present invention includes the steps of forming semiconductor elements into a semiconductor wafer, dicing the semiconductor wafer along scribe areas of the semiconductor wafer so as to dice a semiconductor chip into individual-piece semiconductor chips, forming semiconductor integrated-circuit devices by using the individual-piece semiconductor chips, and testing the semiconductor integrated-circuit devices by connecting two or more semiconductor integrated-circuit devices to one interface circuit, and inputting test waveforms into internal circuits of the two or more semiconductor integrated-circuit devices via the interface circuit, and making a comparison between each judgement response data and judgement reference data, each judgement response data produced from response waveforms generated by the respective internal circuits.

Also, a semiconductor integrated-circuit device fabricating method of the present invention includes the steps of forming semiconductor elements into a semiconductor wafer so as to form semiconductor chips, testing the semiconductor chips by connecting two or more semiconductor chips to one interface circuit, and inputting test waveforms into internal circuits of the two or more semiconductor chips via the interface circuit, and making a comparison between respective judgement response data and judgement reference data, the respective judgement response data produced from response waveforms generated by the internal circuits, dicing the semiconductor wafer along scribe areas of the semiconductor wafer so as to dice the semiconductor chip into individual-piece semiconductor chips, and forming a semiconductor integrated-circuit device by using the individual-piece semiconductor chips.

Other objects, features and advantages of the invention will become apparent from the following description of the embodiments of the invention taken in conjunction with the accompanying drawings.

DETAILED DESCRIPTION OF THE EMBODIMENTS

Hereinafter, based on the drawings, the detailed explanation will be given below concerning embodiments of the present invention.

Figure 1:
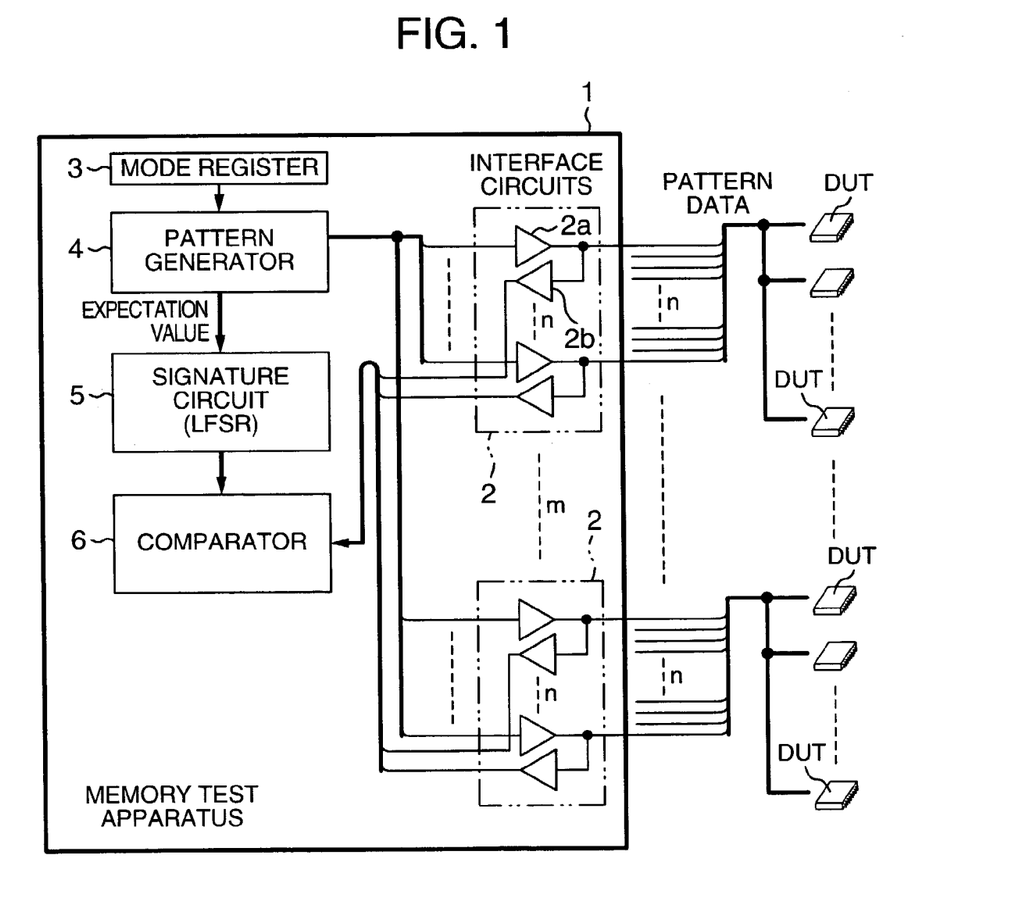
FIG. 1 is a block diagram of a memory test apparatus according to an embodiment of the present invention.
Figure 2:
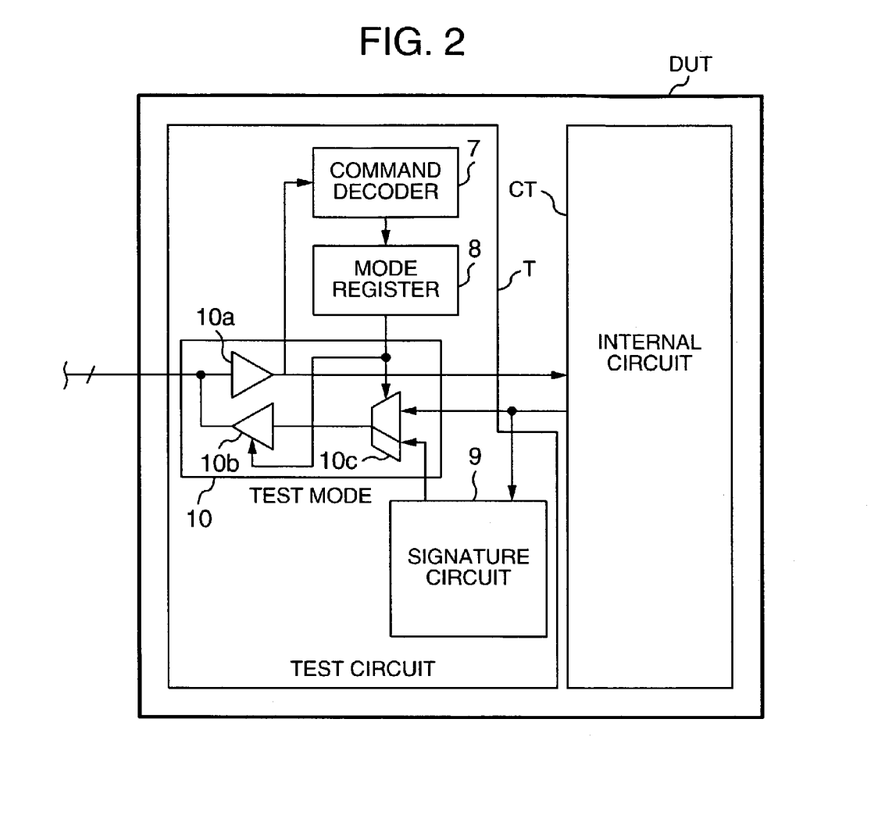
FIG. 2 is a configuration diagram of a test circuit provided in a device-under-test according to the embodiment of the present invention.
Figure 3:
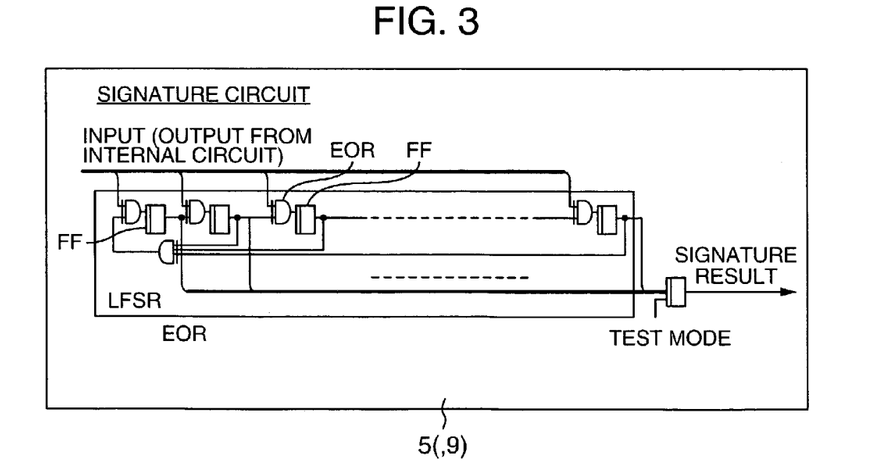
FIG. 3 is a circuit diagram of a signature circuit provided in the memory test apparatus in FIG. 1.
Figure 4:
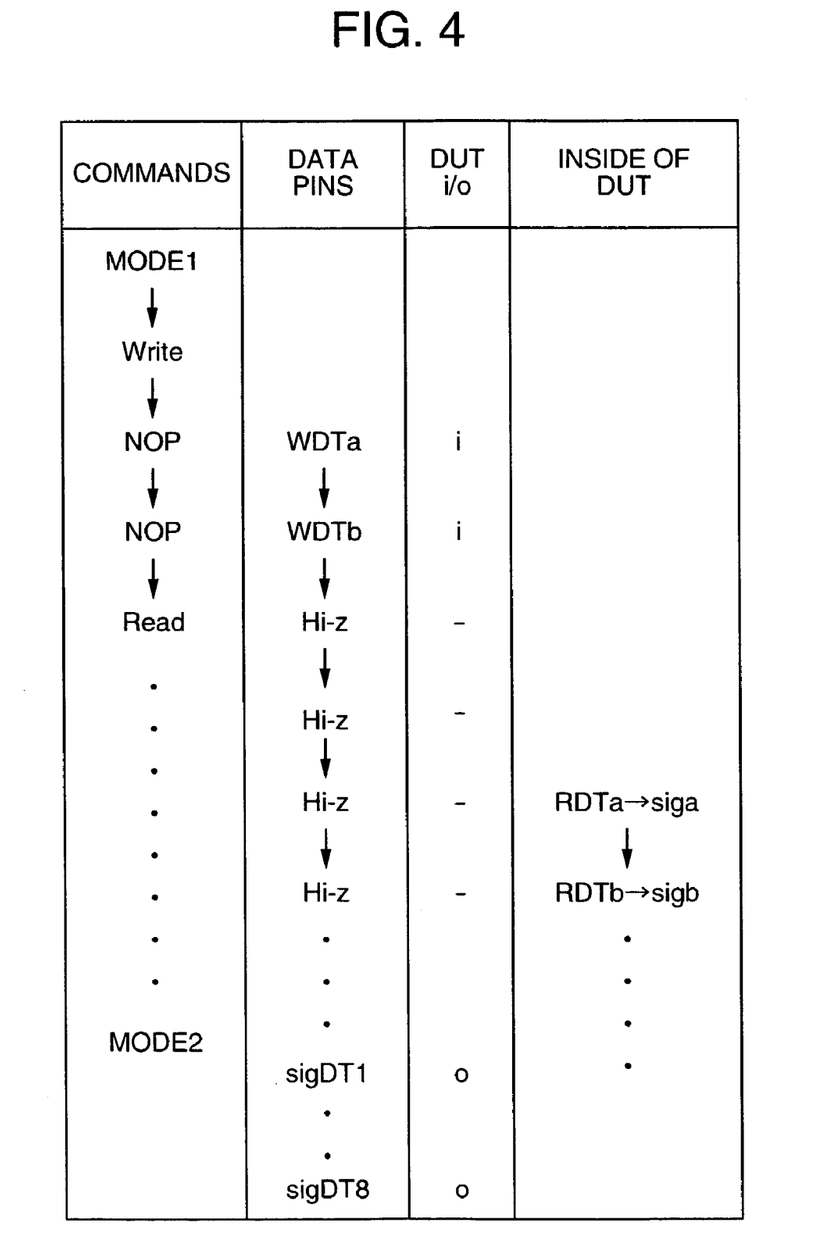
FIG. 4 is a configuration diagram for illustrating an example of a test pattern used in the memory test apparatus in FIG. 1.
Figure 5:
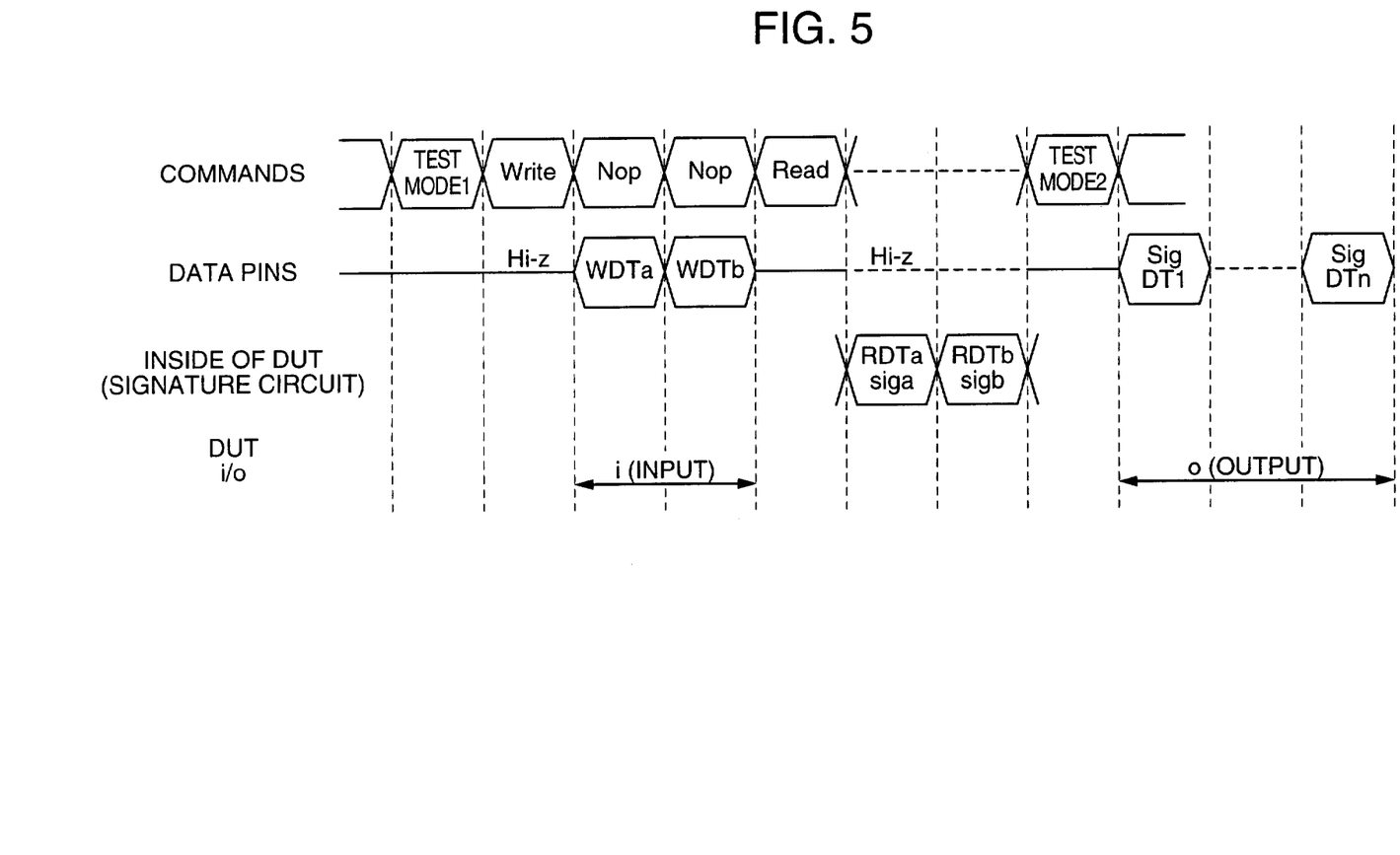
FIG. 5 is an operation timing chart based on the test pattern in FIG. 4.
Figure 6:
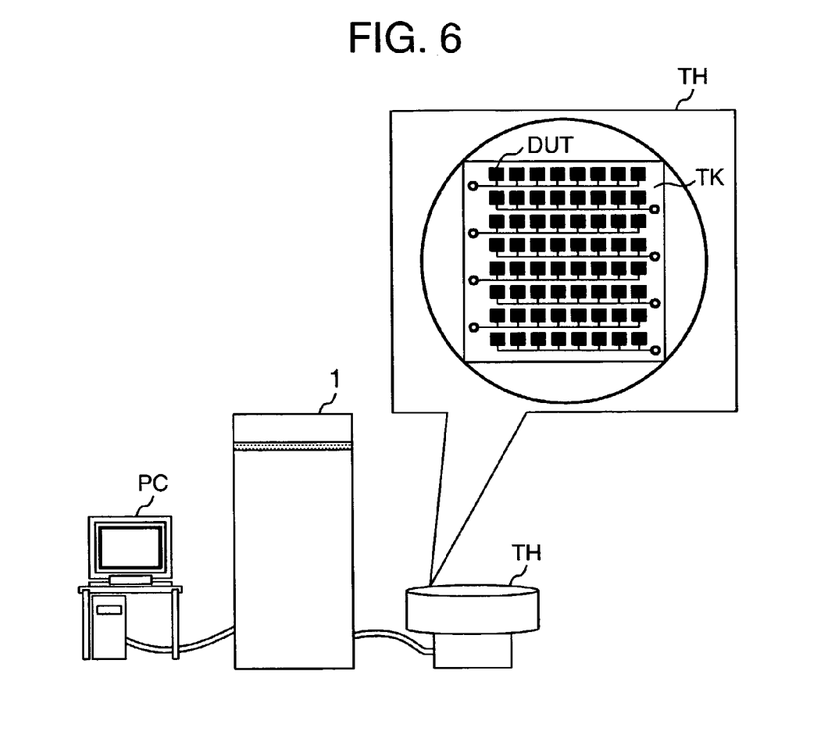
FIG. 6 is a configuration diagram of the memory test apparatus at the time of the screening test.
Figure 7:
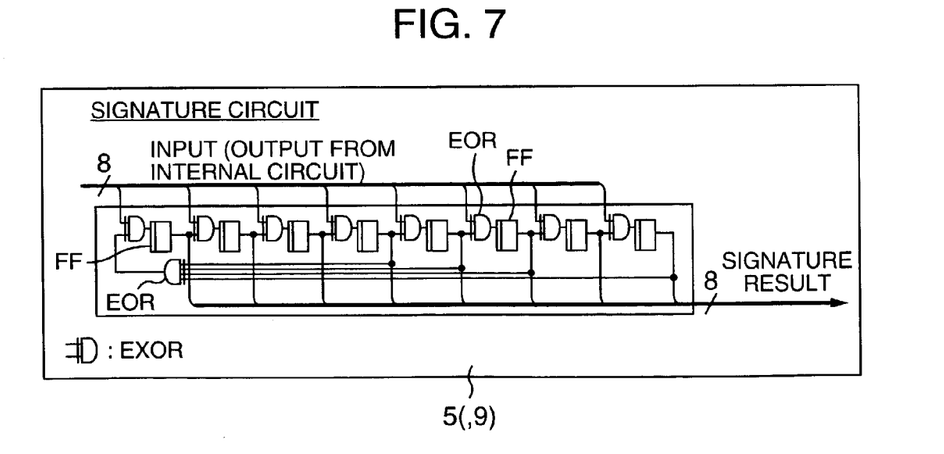
FIG. 7 is a circuit diagram for illustrating an example of the signature circuit for outputting an 8-bit signature value.
Figure 8:
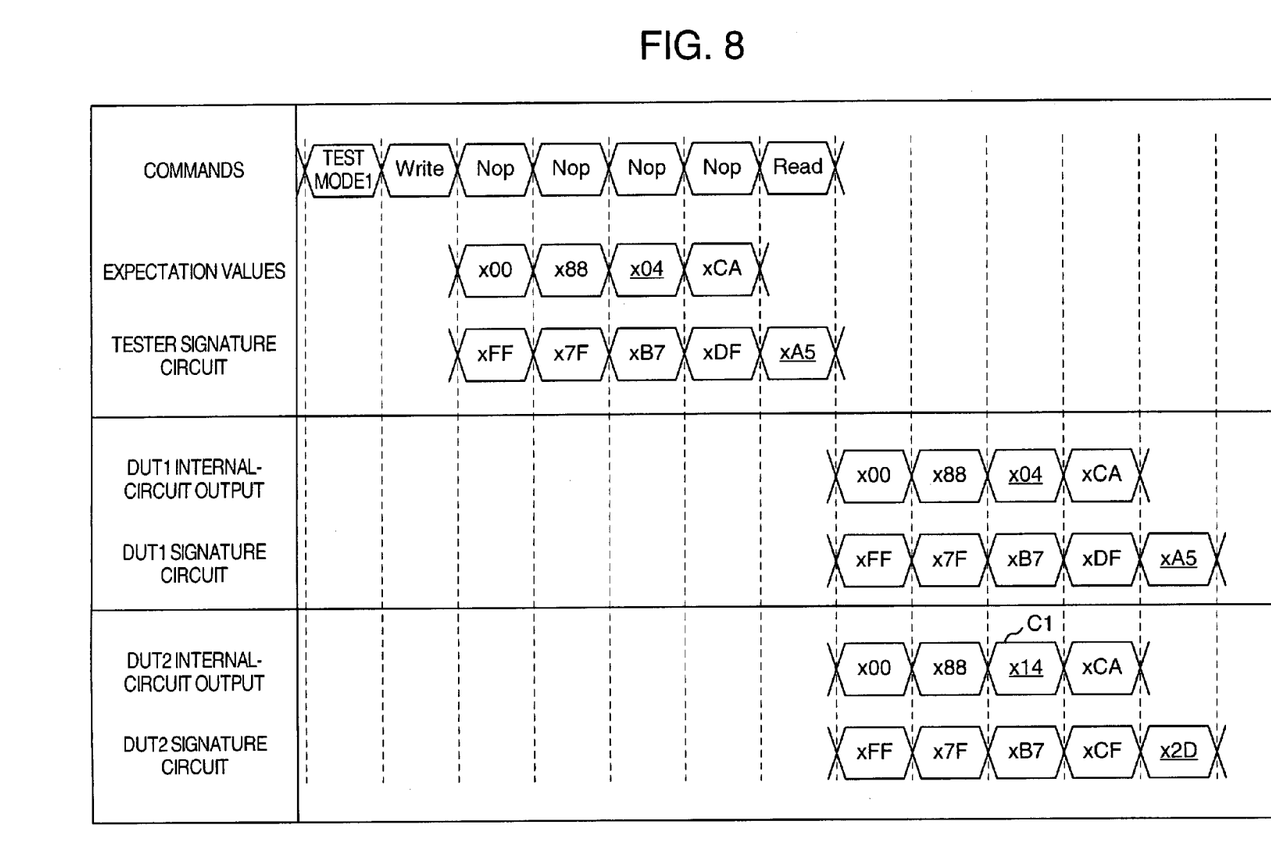
FIG. 8 is a timing chart for illustrating an example of the test operation by the memory test apparatus where the signature circuit is provided.
Figure 9:
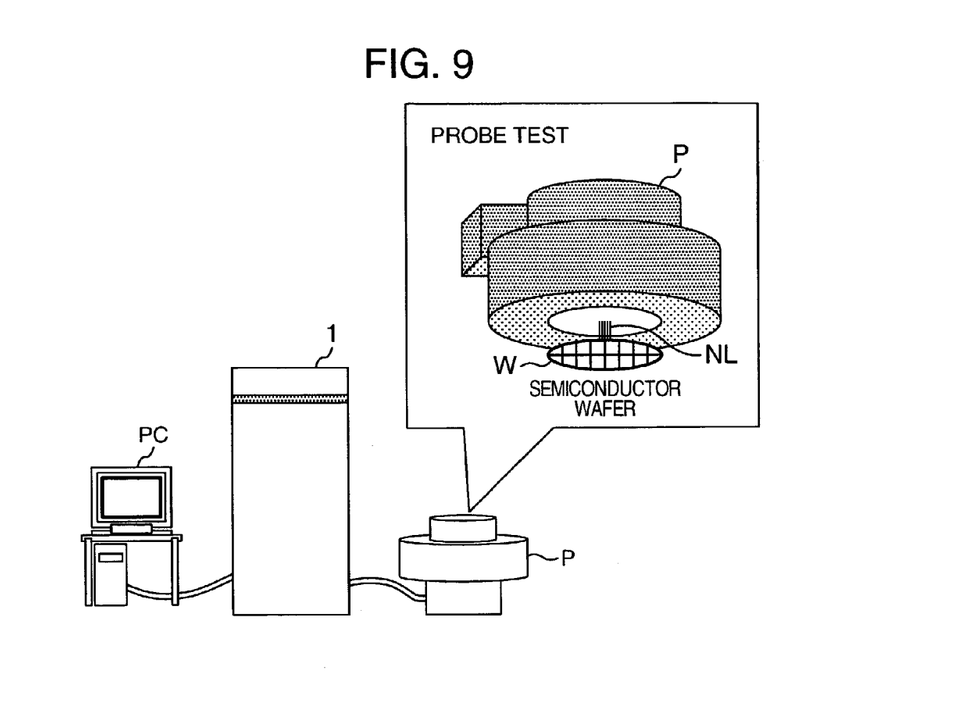
FIG. 9 is a configuration diagram of the memory test apparatus at the time of the probe test.
Figure 10:
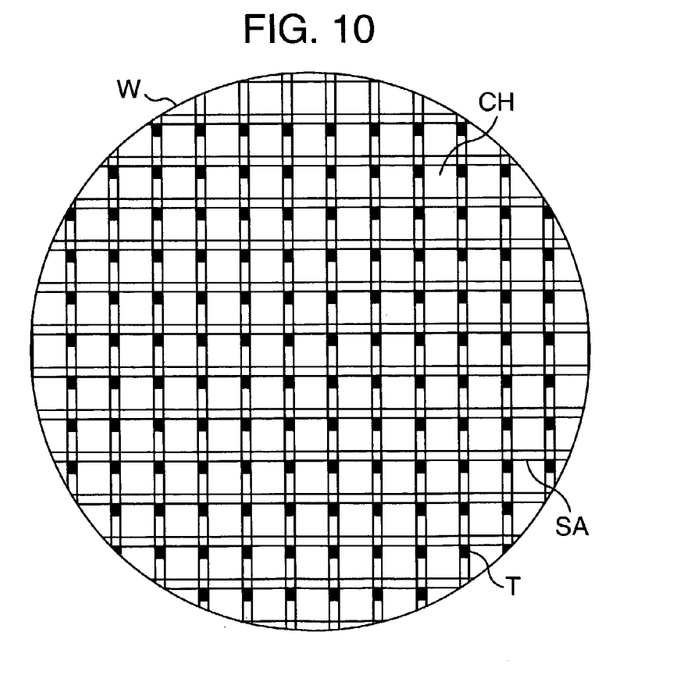
FIG. 10 is a diagram of a semiconductor wafer where the test circuit according to the embodiment of the present invention is formed in the scribe areas.

FIG. 1 is a block diagram of a memory test apparatus according to an embodiment of the present invention, FIG. 2 is a configuration diagram of a test circuit provided in a device-under-test according to the embodiment of the present invention, FIG. 3 is a circuit diagram of a signature circuit provided in the memory test apparatus in FIG. 1, FIG. 4 is a configuration diagram for illustrating an example of a test pattern used in the memory test apparatus in FIG. 1, FIG. 5 is an operation timing chart based on the test pattern in FIG. 4, FIG. 6 is a configuration diagram of the memory test apparatus at the time of the final test, FIG. 7 is a circuit diagram for illustrating an example of the signature circuit for outputting an 8-bit signature value, FIG. 8 is a timing chart for illustrating an example of the test operation by the memory test apparatus where the signature circuit is provided, FIG. 9 is a configuration diagram of the memory test apparatus at the time of the probe test, and FIG. 10 is a diagram of a semiconductor wafer where the test circuit according to the embodiment of the present invention is formed in the scribe areas.

In the present embodiment, a memory test apparatus (i.e., semiconductor testing apparatus) 1 inputs a test pattern, such as addresses, data, and control signals, into the devices-under-test such as synchronous DRAMs. Next, the memory test apparatus judges the outputs from the DUTs, thereby making a distinction between a good piece and a defective one.

As illustrated in FIG. 1, this memory test apparatus 1 includes m units of interface circuits 2, a mode register 3, a pattern generator 4, a signature circuit (i.e., judgement-data generating circuit) 5, a comparator (i.e., comparing circuit) 6, and the like.

The interface circuits 2 are interfaces of the memory test apparatus 1 to the DUTs, devices-under-test. Also, each interface circuit 2 includes drivers 2a and comparators 2b that corresponds to the pin count of each DUT.

The input pattern is applied to the DUTs from the drivers 2a. Also, the comparators 2b check voltage level (L/H) of the response waveforms from the DUTs.

The interface circuit 2 can interface to multiple DUTs simultaneously. Thirty two DUTs can be tested at one time if the memory test apparatus 1 has four set of the interface circuits 2, and the each interface circuits 2 is connected to eight DUTs respectively.

The mode register 3 holds a signal indicating "test mode" where the signature circuit 5 is used. The pattern generator 4 generates an input pattern to be applied to the input pins of each DUT, and an expectation pattern to be applied to the signature circuit 5, respectively.

The signature circuit 5 is a random-number generating circuit including the linear feedback shift register or the like. Based on the expectation pattern applied from the pattern generator 4, the signature circuit 5 outputs an n-bit random number (i.e., signature value). Next, the comparator 6 makes a comparison between the signature value (i.e., judgement reference data) generated by the signature circuit 5 and a signature value (i.e., judgement response data) generated by each DUT. The comparison result shows if the DUT is good or bad.

Also, the explanation will be given below concerning the internal configuration of the DUT tested by the memory test apparatus 1.

As illustrated in FIG. 2, the DUT includes an internal circuit CT and a test circuit T. The internal circuit CT includes a memory array where memory cells, i.e., minimum storage units, are arranged regularly in an array-like manner, and peripheral circuits such as a row/column decoder, a sense amplifier, a column address counter, an address buffer, and a control circuit.

Also, the test circuit T includes a command decoder 7, a mode register 8, a signature circuit (i.e., judgement-response-data generator) 9, and a test set-up control circuit 10.

The command decoder 7 interprets a specific sequence of the command series outputted from the memory test apparatus 1, thus detecting the test mode, a signature read-out mode, and the like. Then, the decoder 7 sets up a test mode signal, a signature read-out mode signal, and the like into the mode register 8, respectively. The mode register 8 holds the test mode signal or the signature read-out mode signal set up by the command decoder 7.

The signature circuit 9 is a random-number generating circuit as is the case with the signature circuit 5 (FIG. 1). Based on a response waveform outputted from the internal circuit CT, the signature circuit 9 generates an n-bit random number (i.e., the signature value).

The test set-up control circuit 10 includes drivers 10a and 10b and a selector 10c. The driver 10a outputs the test pattern, a sequence, or the like, which has been outputted from the memory test apparatus 1, to the command decoder 7 and the internal circuit CT.

The driver 10b, which is equipped with a control terminal, performs an output control over a signal transmitted via the selector 10c on the basis of the signal held in the mode register 8. In the test mode, the driver 10b disables the signal output. Also, at the time of the signature read-out mode, the driver 10b outputs, to the memory test apparatus 1, the signature value from the signature circuit 9 outputted via the selector 10c.

An output part of the signature circuit 9 and the internal circuit CT are each connected to an input part of the selector 10c. The selector 10c switches between the signal sources, depending on the state of the signal held in the mode register 8.

When the mode register 8 holds the signature read-out mode signal, the selector 10c switches to the signature circuit 9 so that the signature value will be passed to the driver 10b. Also, in the case of the test mode, the selector 10c switches to the internal circuit CT.

Here, the explanation will be given below regarding the circuit configuration of the signature circuit 5 (, or the signature circuit 9).

As illustrated in FIG. 3, the signature circuit 5 (, or 9) includes the LFSR (: Linear Feedback Shift Register) which, further, includes exclusive-OR circuits EORs and flip-flops FFs.

In order to apply a multi-bit data to the LFSR, as an external disturbance to the random number generation, an input is applied to each flip-flop FF via each exclusive-OR circuit EOR. The exclusive-OR operation of values of several specific flip-flops in the shift register is performed, and then the feedback is exerted onto the input flip-flops in the shift register, thereby implementing a random-number series.

Figure 11:
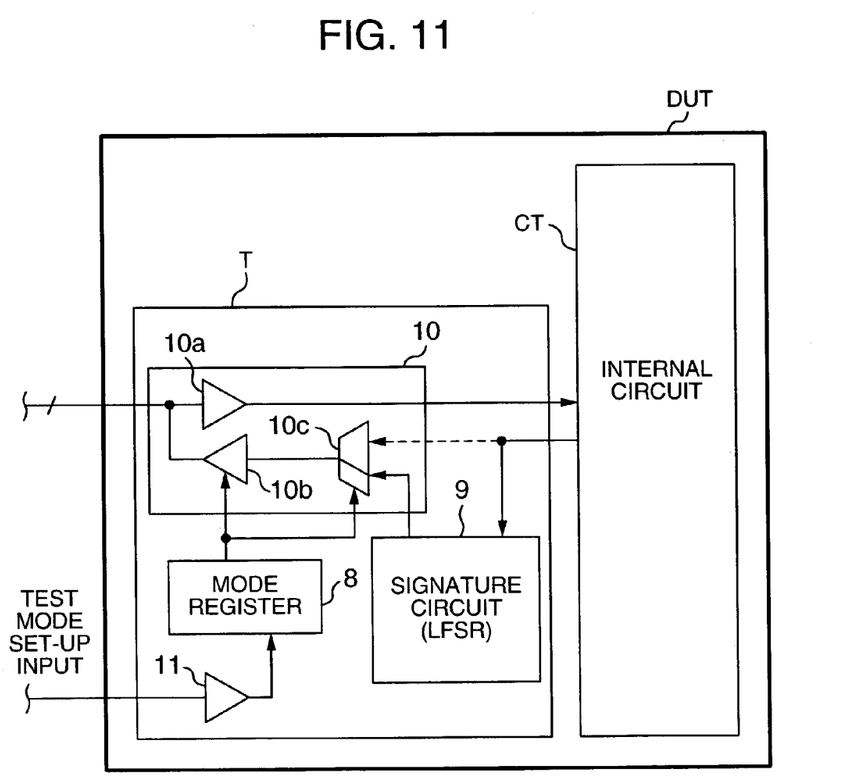
FIG. 11 is a configuration diagram of a test circuit provided in a to-be-tested device according to another embodiment of the present invention.

Furthermore, as illustrated in FIG. 11, as an alternative method to set up the test mode. The DUT may be equipped with a test-mode set-up input pin TP, and the command such as the test mode may be inputted therein via this test-mode set-up input pin TP.

In this case, the test circuit T includes the mode register 8, the signature circuit 9, the test set-up control circuit 10, and a driver 11.

The circuit configuration of the mode register 8, the signature circuit 9, and the test set-up control circuit 10 is basically the same as the one illustrated in FIG. 2. A point that differs therefrom is that an input part of the driver 11 is connected to the test-mode set-up input pin TP, and that an output of the driver 11 is connected to the mode register 8. This new attachment of this test-mode set-up input pin TP makes it possible to make the command decoder 7 (FIG. 2) unnecessary.

Next, referring to an example of the test pattern in FIG. 4, and the operation timing chart in FIG. 5, the explanation will be given below concerning the operation of the memory test apparatus 1.

Here, the following assumption is made: The memory test apparatus 1 includes m units of the interface circuits 2, and k units of the DUTs are connected to each interface circuit 2 in parallel. Accordingly, m×k units of the DUTs will be tested.

Also, FIG. 4 illustrates, from the left to the right, the following information, respectively: Commands outputted from the memory test apparatus 1 to the DUTs, signal states in the data pins of the DUTs, states of the signals inputted/outputted into/from the DUTs, and signal states inside the DUTs.

FIG. 5 illustrates, from the above to the below, the following information, respectively: The commands outputted from the memory test apparatus 1 to the DUTs, the signal states in the data pins of the DUTs, the signal states inside the DUTs, and the states of the signals inputted/outputted into/from the DUTs.

At first, if the memory test apparatus 1 outputs a command 'MODE 1' for indicating a test-mode activation, the command decoder 7 detects the test-mode activation, then setting up the test mode signal into the mode register 8. When the test mode signal has been set up into the mode register 8, the driver 10b disables any signal output.

Moreover, the memory test apparatus 1 outputs a write command 'Write' and write data one after another. This write command 'Write' causes each DUT to execute the write-in operation and to store the write data into the memory array.

When the write-in operation is over, the memory test apparatus 1 outputs a read command 'Read'. Each DUT executes the read-out operation in accordance with the read command 'Read' inputted therein, thereby reading out the stored data from the memory array.

At this time, since the driver 10b disables any signal output, the data pins of each DUT has fallen in a floating state, i.e., a high-impedance state.

The read-out information is fed into the signature circuit 9 from the internal circuit CT. At this time, expectation values (i.e., the pattern data) generated by the pattern generator 4 has been applied to the signature circuit 5 in the memory test apparatus 1.

Furthermore, when each DUT has finished the read-out operation, the memory test apparatus 1 outputs a command 'MODE 2' for indicating the signature read-out mode.

Having received this command 'MODE 2', the command decoder 7 in each DUT sets up the signature read-out mode signal into the mode register 8. When the signature read-out mode signal has been set up, the selector 10c switches the data source so that the signature circuit 9 data will be passed to the driver 10b. At the same time, the driver 10b enables its signal output. Accordingly, the signature data generated by the signature circuit 9 is outputted to the memory test apparatus 1.

Also, in the memory test apparatus 1, the signature circuit 5 generates the signature data from the expectation data pattern generated by the pattern generator 4. Next, the comparator 6 sequentially makes comparisons between the respective signature data generated by the respective signature circuits 9 in the respective DUTs and the signature data generated by the signature circuit 5 in the memory test apparatus 1. This allows the comparator 6 to judge whether the respective DUTs are good or defective.

FIG. 6 is a diagram of the memory test apparatus 1 in the screening test of the DUTs at production.

A personal computer PC and a test head TH are each connected to the memory test apparatus 1. The personal computer PC controls the memory test apparatus 1.

On the test head TH, there is provided a test-head board TK or the like for mounting thereon the DUTs, and the test head TH supplies the device power to the DUTs. The board TK mounts thereon the plural number (: m×k units) of to-be-tested devices DUTs.

Here, the explanation will be given below regarding an example of the test operation in the case of the memory test apparatus 1 and the DUTs where there is provided the signature circuit 5 or 9 illustrated in FIG. 7 that generates an 8-bit signature data.

FIG. 8 is a timing chart of the signals from the memory test apparatus 1, and of the signals from DUT 1 and DUT 2. Here, the DUT 1 illustrated is a good product, and the DUT 2 illustrated is a defective product.

Also, FIG. 8 illustrates, from the above to the below, the following information, respectively: The commands outputted from the memory test apparatus 1, the expectation data generated by the pattern generator 4 in the memory test apparatus 1, the signature data generated by the signature circuit 5 in the memory test apparatus 1, the signals outputted from the internal circuit CT in the DUT 1, the signature data generated by the signature circuit 9 in the DUT 1, the signals outputted from the internal circuit CT in the DUT 2, and the signature data generated by the signature circuit 9 in the DUT 2.

After outputting a command 'MODE 1' for indicating a test-mode activation, the memory test apparatus 1 outputs a write command 'Write' and write data one after another. This write command 'Write' causes the DUT 1 and DUT 2 to execute the write-in operations and to store the write data into the respective memory arrays.

At this time, in the memory test apparatus 1, the signature circuit 5 generates the signature data from the expectation data pattern generated by the pattern generator 4.

Moreover, when the write-in operations are over, the memory test apparatus 1 outputs a read command 'Read'. The DUT 1 and DUT 2 execute the read-out operations in accordance with the read command 'Read', thereby reading out the data from the respective memory arrays.

The read-out information is inputted into the respective signature circuits 9 from the internal circuits CT in the respective DUT 1 and DUT 2. Next, the respective signature circuits 9 generate the respective signature data.

In this case, in FIG. 8, the output signals outputted from the internal circuit CT in the good DUT 1 are the same as the expectation values generated by the pattern generator 4. In the detective DUT 2, however, there exists an error in the 3rd-cycle output signal C1 outputted from the internal circuit CT. Consequently, it turns out that there will occur a change in the series of the signature data generated by the signature circuit 9 in the DUT 2.

As a result, despite the fact that the final signature value generated by the signature circuit 5 is 'A5', the final signature value generated in the DUT 2 has been found to be '2D'. This result indicates that there exists some error in the series of responses.

Next, FIG. 9 shows the memory test apparatus 1 in the probe test for running an electrical test on semiconductor chip (i.e., DUTs) formed on a semiconductor wafer W.

In this case, a personal computer PC and a probe card P are each connected to the memory test apparatus 1. The personal computer PC controls the memory test apparatus 1.

On the probe card P, there are provided electrically-conductive needles NL that are arranged in agreement with the location of I/O pads formed on the semiconductor chip on the semiconductor wafer W. In addition, the needles arranged on the probe card are caused to come into contact with the I/O pads of the semiconductor chip, thereby running the test on the DUT.

Also, in the semiconductor wafer W, as illustrated in FIG. 10, each test circuit T may also be formed in scribe areas SA, i.e., cutting lines along which respective semiconductor chips CH should be cut into individual pieces.

Forming each test circuit T in the scribe areas SA makes each test circuit unnecessary within each DUT at the time of the probe test, thereby making it possible to miniaturize each DUT.

This condition, according to the present embodiment, allows the test to be carried out in the state where the plural units of DUTs are connected to each interface circuit 2. This makes it possible to tremendously enhance the test efficiency for the DUTs.

Also, there is no need of increasing the number of the interface circuits 2. This makes it possible to suppress the cost of one memory test apparatus 1.

It is needless to say that the present invention is not limited to the above-described embodiments, and that the various types of modifications are possible within a range of not departing from the essence thereof.

Figure 12:
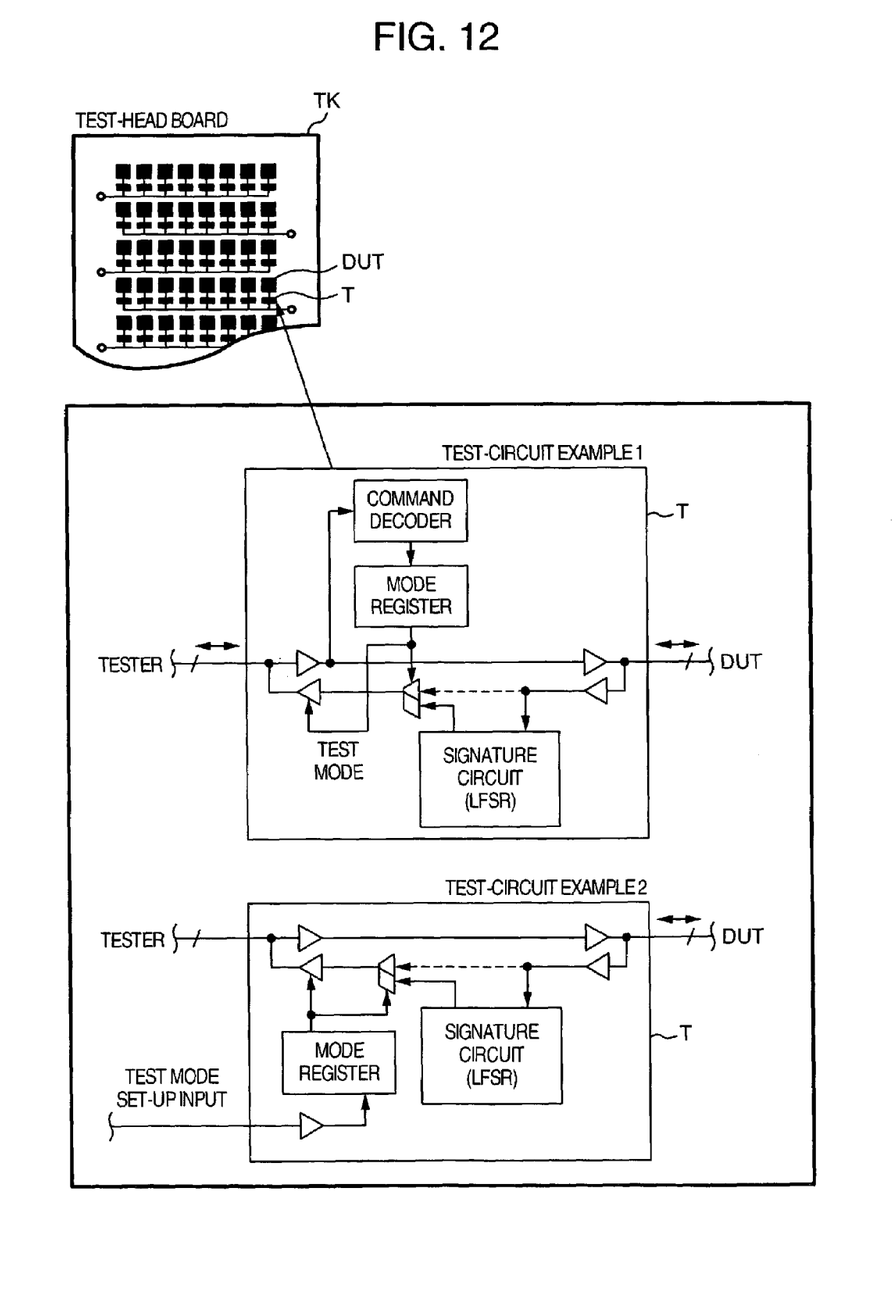
FIG. 12 is a diagram for illustrating an example of a test circuit provided in a test head according to another embodiment of the present invention.

For example, in the above-described embodiments, the explanation has been given concerning the case where each test circuit is provided within each device. At the time of the screening test, however, as illustrated in FIG. 12, each test circuit T may be provided not within each device but on the test-head board TK provided on the test head.

The test circuit T illustrated above in FIG. 12 is of the circuit example where the device is not equipped with the test-mode set-up input pin. Consequently, the circuit configuration thereof is the same as that of the test circuit T in FIG. 2.

Moreover, the test circuit T illustrated below is of the circuit example where the to-be-tested device is equipped with the test-mode set-up input pin. Consequently, the circuit configuration thereof is basically the same as the one in FIG. 11.

This makes the test circuit unnecessary within the to-be-tested device, thereby making it possible to miniaturize the to-be-tested device.

Also, according to the above-described embodiments, the configuration has been selected where the test circuit is provided in the memory test apparatus as well as in the to-be-tested device. A configuration, however, may also be selectable where the test circuit is provided in only the to-be-tested device.

In this case, the expected signature data is stored in the memory test apparatus in advance. Next, the comparator makes a comparison between the signature values generated by the signature circuit in the DUTs and the expected signature data, thereby judging whether the DUT is good or defective.

Furthermore, in the above-described embodiments, the configuration has been selected where the random-number generating signature circuit is provided in the memory test apparatus as well as in the to-be-tested device. This signature circuit, however, may be a cumulating circuit for cumulating and outputting the expectation values and the response waveforms from the internal circuits CT respectively.

The present invention allows a large number of semiconductor integrated-circuit devices to be tested in a short time and with a high efficiency.

Also, the present invention makes it possible to implement the miniaturization and cost-lowering of the semiconductor testing apparatus.

Moreover, the present invention makes it possible to enhance a production throughput of the semiconductor integrated-circuit devices.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor testing apparatus, comprising:
    a pattern generating circuit for generating a test waveform for testing a semiconductor integrated-circuit device, and generating pattern data including information on said test waveform,
    a judgement-data generating circuit for generating judgement data from said pattern data, and
    a comparator circuit for making a comparison between judgement response data and said judgement data, and judging whether or not said judgement response data and said judgement data match with each other, said judgement response data being outputted from said semiconductor integrated-circuit device, said judgement data being generated by said judgement-data generating circuit,
    wherein said judgement-data generating circuit includes a random-number generating circuit for generating a random number from said pattern data.

2. The semiconductor testing apparatus as claimed in claim 1, wherein said judgement-data generating circuit includes a cumulating circuit for cumulating said pattern data.

3. A semiconductor integrated-circuit device testing method, comprising the steps of:
    connecting two or more semiconductor integrated-circuit devices to one interface circuit,
    inputting test waveforms into internal circuits of said two or more semiconductor integrated-circuit devices via said one interface circuit, respectively,
    generating judgement response data in said respective semiconductor integrated-circuit devices, said judgement response data each produced from response waveforms generated by said internal circuits, and making a comparison between said judgement response data and judgement data on said each semiconductor integrated-circuit device basis, said judgement response data being produced by said respective semiconductor integrated-circuit devices, said judgement data being set up in advance, wherein said judgement response data is a random number generated from said response waveforms generated by said internal circuits.

4. The semiconductor integrated-circuit device testing method as claimed in claim 3, wherein said judgement response data is data that results from cumulating said response waveforms generated by said internal circuits.

5. A semiconductor integrated-circuit device testing method, comprising the steps of:

connecting two or more semiconductor integrated-circuit devices to one interface circuit, inputting test waveforms into internal circuits of said two or more semiconductor integrated-circuit devices via said one interface circuit, generating judgement response data in said respective semiconductor integrated-circuit devices, said judgement response data each produced from response waveforms generated by said internal circuits, and making a comparison between judgement data and said judgement response data on said each semiconductor integrated-circuit device basis, said judgement response data being produced by said respective semiconductor integrated-circuit devices, said judgement data generated from an expectation data pattern.

wherein said judgement response data is a random number generated from said response waveforms generated by said internal circuits.

* * * * *